(12) United States Patent  
Baxter

(10) Patent No.: US 9,316,735 B2  
(45) Date of Patent: *Apr. 19, 2016

(54) PROXIMITY DETECTION APPARATUS AND ASSOCIATED METHODS HAVING SINGLE PHOTON AVALANCHE DIODES FOR DETERMINING A QUALITY METRIC BASED UPON THE NUMBER OF EVENTS

(71) Applicant: STMICROELECTRONICS (RESEARCH & DEVELOPMENT) LIMITED, Marlow Bucks (GB)

(72) Inventor: David Patrick Baxter, Edinburgh (GB)

(73) Assignee: STMICROELECTRONICS (RESEARCH & DEVELOPMENT) LIMITED, Marlow Bucks (GB)

( * ) Notice: Subject to any disclaimer, the term of this patent is extended or adjusted under 35 U.S.C. 154(b) by 250 days.

This patent is subject to a terminal disclaimer.

(21) Appl. No.: 14/100,781

(22) Filed: Dec. 9, 2013

(65) Prior Publication Data

US 2014/0091206 A1 Apr. 3, 2014

Related U.S. Application Data

(63) Continuation of application No. 13/238,710, filed on Sep. 21, 2011, now Pat. No. 8,610,043.

(30) Foreign Application Priority Data

Nov. 30, 2010 (GB) .................................. 1020278.6

(51) Int. Cl.
*G01S 17/02* (2006.01)
*H01L 31/02* (2006.01)
*H01L 31/107* (2006.01)

(52) U.S. Cl.
CPC .......... *G01S 17/026* (2013.01); *H01L 31/02019* (2013.01); *H01L 31/107* (2013.01)

(58) Field of Classification Search
CPC ....... G01S 17/026; G01S 17/89; G01S 15/42; H01L 31/107; H01L 31/02027

USPC ....... 250/214 R, 214.1, 221, 208.1; 356/4.01, 356/5.01, 141.1; 327/514, 515, 320–326
See application file for complete search history.

(56) References Cited

U.S. PATENT DOCUMENTS

| | | | |
|---|---|---|---|
| 5,194,727 A * | 3/1993 | Johnson et al. | ........... 250/214 R |
| 5,933,042 A | 8/1999 | Trottier et al. | |
| 7,262,402 B2 | 8/2007 | Niclass et al. | |
| 7,301,608 B1 | 11/2007 | Mendenhall et al. | |
| 2007/0182949 A1 | 8/2007 | Niclass | |

FOREIGN PATENT DOCUMENTS

| | | |
|---|---|---|
| EP | 1993146 | 11/2008 |
| WO | 9320458 | 10/1993 |
| WO | 2010149593 | 12/2010 |

OTHER PUBLICATIONS

Niclass et al., "Design and characterization of a CMOS 3-D image sensor based on single photon avalanche diodes", IEEE Journal of Solid-State Circuits, vol. 40, No. 9, Sep. 2005, pp. 1847-1854.

* cited by examiner

*Primary Examiner* — Que T Le

(74) *Attorney, Agent, or Firm* — Allen, Dyer, Doppelt, Milbrath & Gilchrist, P.A.

(57) ABSTRACT

A proximity detector may include an array of single photon avalanche diodes (SPADs) and an illumination source. Illumination from the illumination source may be reflected by a target to the array of single photon avalanche diodes. The SPADs may be operable to detect events. A number of events detected may be dependent on a level of illumination incident on the SPADs. The proximity detector may then determine a quality metric and calculate an output when the quality metric is at a predetermined level. A related method may include regulating the quality of the data on which such a proximity detector apparatus calculates its output.

25 Claims, 2 Drawing Sheets

PROXIMITY DETECTION APPARATUS AND ASSOCIATED METHODS HAVING SINGLE PHOTON AVALANCHE DIODES FOR DETERMINING A QUALITY METRIC BASED UPON THE NUMBER OF EVENTS

FIELD OF THE INVENTION

The present invention relates to a proximity sensor using a single photon avalanche diode (SPAD).

BACKGROUND OF THE INVENTION

A SPAD is based on a p-n junction device biased beyond its breakdown region. The high reverse bias voltage generates a sufficient magnitude of electric field such that a single charge carrier introduced into the depletion layer of the device can cause a self-sustaining avalanche via impact ionization. The avalanche is quenched, either actively or passively to allow the device to be "reset" to detect further photons. The initiating charge carrier can be photo-electrically generated by means of a single incident photon striking the high field region. It is this feature which gives rise to the name 'Single Photon Avalanche Diode'. This single photon detection mode of operation is often referred to as a 'Geiger Mode'.

U.S. Pat. No. 7,262,402 to Niclass et al. discloses an imaging device using an array of SPADs for capturing a depth and intensity map of a scene, when the scene is illuminated by an optical pulse. U.S. Patent Application Publication No. 2007/0182949 to Niclass discloses an arrangement for measuring the distance to an object. The arrangement uses a modulated photonic wave to illuminate the object and an array of SPADs to detect the reflected wave. Various methods of analysis are disclosed to reduce the effects of interference in the reflected wave.

When using a SPAD as a solid state photo-detector for ranging, proximity detection, accelerometry, etc., a certain desired quality must be achieved for an accurate range reading. Currently the user must set a fixed number of LED pulses, the accumulation period, in which to attempt to achieve this quality.

SUMMARY OF THE INVENTION

It is an object of the present invention to overcome at least some of the problems associated with the prior art, and more particularly, to address the issue of the user setting the number of LED pulses to achieve a desired quality.

According to one embodiment, a proximity detection apparatus may comprise an array of single photon avalanche diodes (SPAD) and an illumination source. The proximity detection apparatus may be operable such that the illumination from the illumination source is reflected by a target to the array of single photon avalanche diodes. The single photon avalanche diodes may be operable to detect events, the number of which detected being dependent on the level of illumination incident on the single photon avalanche diodes. The proximity detection apparatus may be operable to determine a quality metric and to calculate an output when the quality metric is at a predetermined level.

Another aspect is directed to a method of regulating the quality of the data on which a proximity detector calculates its output. The proximity detector may comprise an array of single photon avalanche diodes (SPADs), and an illumination source. The method may include turning on the illumination source such that the illumination from the illumination source is reflected by a target to the array of single photon avalanche diodes. The method may also include counting the number of events detected by the single photon avalanche diodes, the number of the events may be dependent on the level of illumination incident on the single photon avalanche diodes. The method may also include deriving a quality metric from the number of events counted, and when the quality metric is at a predetermined level, calculating an output based on the proximity of the target from a number events which exceed the predetermined level.

BRIEF DESCRIPTION OF THE DRAWINGS

FIG. 1b is a timing diagram associated with the SPAD in FIG. 1a.

DETAILED DESCRIPTION OF THE PREFERRED EMBODIMENTS

Figure 1A:
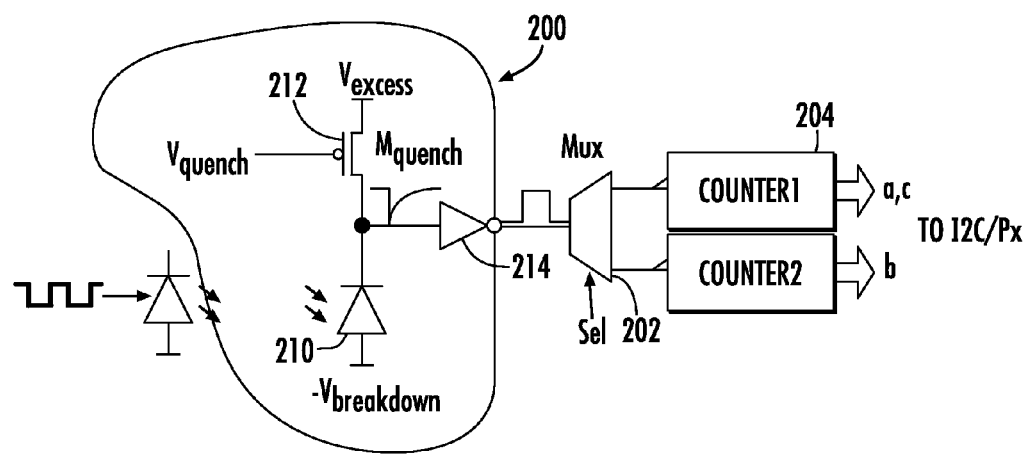
FIG. 1a is a schematic diagram of a SPAD in accordance with an embodiment of the present invention.

The idea that a SPAD can be used as in a ranging application is borne out by the application of a Phase Shift Extraction Method for range determination, although alternative methods exist for range determination using SPADs based on direct time of flight measurement. The term ranging in this application is intended to cover all ranging devices and methods including, but not limited, to ranging devices, proximity devices, accelerometers, etc. Ranging can occur in a number of applications, including proximity detection which is relatively easy to implement and inexpensive, laser ranging, which is more complex and costly than a proximity detector, and three-dimensional imaging, which is a high-end application that could be used to recognize gestures and facial expressions.

A proximity sensor is the most basic of the ranging applications. At its simplest, the sensor is capable of indicating the presence or absence of a user or object. Additional computation and illuminator complexity can provide enhanced data, such as, the range to an object. A typical range may be of the order of 0.01 m to 0.5 m. In a proximity sensor, the illumination source could be a modulated LED at a wavelength of about 850 nm.

The next application group is that of laser ranging, where the illumination source is a modulated diode laser. Performance may range from <1 cm to 20 m range (and higher for top end systems) with millimetric accuracy. Optics are enhanced with hemispherical lenses and narrow bandpass filters. A near-field return may result in the introduction of parallax error, i.e. movement of the returned laser spot over the sensor pixel array based upon distance to an object. To address these problems, the ranger includes calibration functions to enable the subtraction of the electronic and optical delay through the host system. The illumination source wavelength should be visible so that the user can see what is being targeted and is typically around 635 nm.

The third application group is that of three-dimensional (3D) cameras. In this application a pixel array is used to avoid mechanical scanning of the array. Systems can be based on a number of different architectures. Both time of flight (TOF) and modulated illuminator based architectures are used, however, the latter is more robust to ambient light, and thus fits best with established photodiode construction. Additional features, such as face and gesture recognition, are applications of this type of ranging device.

Most optical ranging implementations use either stereoscopic, structured light, direct time of flight or phase extraction methods to ascertain the range to a target. Stereoscopic solutions use two conventional cameras, and may have a relatively heavy computational overhead to extract the range. The structured light scheme uses diffractive optics, and the range is computed using a conventional camera based on how a known projected shape or matrix of spots is deformed as it strikes the target. The direct time of flight (TOF) method uses a narrow pulsed laser, with a time-digital converter (TDC) measuring the difference in time between transmission and first photon reception. Commonly, a 'reverse mode' is employed, where the TDC measures the back-portion of time, i.e., the time from first photon reception to next pulse transmission. This scheme reduces system activity to the occasions where a photon is detected, and is therefore well matched to tightly controlled, low photon flux levels and medical applications, such as fluorescent lifetime microscopy (FLIM).

The phase extraction method may be the most commonly used method, as it is typically well suited to systems which implement computation of the generalized range equation using existing photodiode technology. It is also robust to background ambient light conditions, and may allow for varying illuminator modulation wave-shapes (i.e. sinusoidal or square). This scheme is typically favored for SPADs in proximity detection applications.

It should be appreciated that the phase extraction method system incorporates an inherent ambient light level detection function, which can be used in conjunction with a SPAD for many applications. It is important to understand the range equation derivation, as it indicates the ease of applicability of SPADs to phase extraction proximity detection and ranging approaches. It also aids in the understanding of inherent features, such as ambient light metering and measuring a depth of interest for a specific purpose.

Distance is determined from the speed of light and TOF, as follows:

$$s = ct$$

Where s is distance, c the speed of light and t is time. For a ranging system however, the distance is doubled due to the fact there are send and receive paths. As such the distance measured in a ranging system s is given by:

$$s = \tfrac{1}{2} ct$$

The time shift component (='t') due to the photon TOF, is dependent on the modulation frequency and phase shift magnitude of the waveform.

$t = \%$ shift of the returned waveform $\times t_{mod\_period}$ and if $t_{mod\_period} = 1/f_{mod}$:

$$\Rightarrow t = \frac{\phi}{2\pi} \cdot \frac{1}{f}$$

$$\Rightarrow t = \frac{\phi}{2\pi \cdot f}$$

The units are in radians. Then by substituting the above equation back into the starting equation, the 'range equation' is expressed as:

$$\Rightarrow s = \frac{c \cdot \phi}{4\pi \cdot f}$$

The critical component in this equation is $\phi$, which is the unknown component of the percent shift of the returned waveform. The following section discusses how this can be determined.

Since the values of c, f and n are all constants, the range result simply scales with $\phi$, (the percent shift of the received light waveform in relation to that which was transmitted). FIG. 1 illustrates how $\phi$ may be determined for a system employing a square wave modulated illuminator. It should be noted that other shapes of modulation waves are possible and within the scope of the present embodiments, and the example given below may be adapted for other modulation shapes. The transmitted and received waveforms are shifted from one another by $\phi$. By measuring the photons that arrive in "a" and "b" in bins 1 and 2 respectively the value of $\phi$ can be determined as follows:

$$\frac{\phi}{2\pi} = \frac{b_{count}}{(a+b)_{count}}$$

In this type of system there is a range limit set by the illuminator modulation frequency, which is known as the unambiguous range. Photons received from targets that are further away than this range can introduce an aliasing error by erroneously appearing in a legitimate bin for a subsequent measurement. Since determination of range is enabled by the modulation process, it may be desirable to increase or maximize the number of edges of the modulation waveform to accumulate data for averaging purposes as fast as possible. However, a high modulation frequency may lower the unambiguous range and introduces more technical complexity in the illuminator driver circuitry. Also, the upper modulation frequency is itself usually limited by the illumination source characteristics, and the use of lower cost devices with lower quality illumination sources may necessitate a lower maximum modulation frequency. Two or more different modulation frequencies may be interleaved or used intermittently, so as to reduce or negate the impact of aliased photons via appropriate data processing.

Figure 1B:
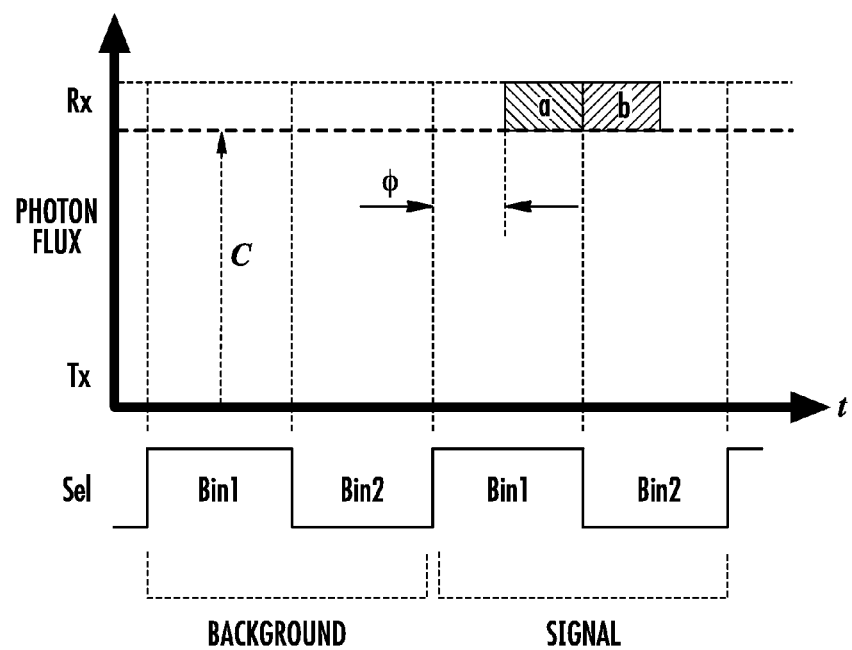

FIGS. 1a and 1b illustrate a possible implementation of a SPAD based proximity sensor with an associated waveform diagram, respectively. FIG. 1a shows a SPAD 200 connected to a multiplexer 202. The output from the multiplexer passes through counters 1 and 2 (204). The SPAD device shown generally at 200 is of a standard type, including a photo diode 210, a p-type MOSFET 212 and a NOT gate 214.

The timing waveforms (FIG. 1b) are shown in such a way so as to represent the relative photon arrival magnitudes. It can be seen that an extra phase has been added to enable computation of the background ambient light level offset 'c', although this can be significantly reduced by the use of a narrow optical band-pass filter matched to the illuminator wavelength if desired. The element 'c' is then accommodated in the computation of received light phase shift $\phi$. The computed results for a, b, c are determined and written into either a temporary memory store or an I2C register. The computation of the phase shift $\phi$, is calculated as follows:

$$\phi = \frac{a_{count} - c}{(a+b)_{count} - 2c}$$

The predetermined selection of the modulation frequency is performed by dedicated logic or a host system which selects a suitable frequency or frequencies for the application of the range sensor. The calculated range of the range sensor of FIG. 1a is dependent on the amount of light that can be transmitted on to the scene and the system power consumption.

Since the system shown in FIG. 1a needs to compute the background light condition to ascertain the offset of the returned light pulse from the target, ambient light metering is included. A simplified timing scheme is employed if the ambient light level data is desired, since the target illumination cycle may not be necessary. If a narrow band IR filter is employed in the optical path, the value of c represents only the content of the filter passband. This can then be extrapolated to an approximation of the general ambient light conditions.

When using the "Phase Extraction Method" as described above, a certain quality may be desired for an accurate range reading. This quality is related to the number of photons received, and therefore, events measured by the SPAD for each computed result (phase shift), such that each computed result is based upon enough events to reduce the impact of external factors such as ambient light. The quality is derived from the bin readings. One possible quality metric is shown below.

quality=$(a+b)-(2\cdot\text{ambient})$ where: a=SPAD Event measurement (count) during Bin 1
b=SPAD Event measurement (count) during Bin 2
ambient=SPAD Event measurement (count) during the ambient bin.

Factors which may effect the quality include ambient light conditions, LED power, target reflectivity and target size.

As previously mentioned, in the system described, the user enters a quality threshold which dictates when a calculated range value is valid. For the quality threshold to be achieved, a certain number of SPAD events must be counted/measured in the appropriate bin, as described above. For this to occur, a relatively large number of LED pulses are typically required to build up enough SPAD events, and therefore enough statistical data for the range equation to apply.

To meet the desired quality, the user would typically set a fixed number of LED pulses for the SPAD events to be accumulated, as would seem appropriate based on previous observations, and hope that the quality threshold is reached during this period in the present circumstances. The user might normally choose to "play safe" and set the number of LED pulses to a larger number than for most sets of conditions.

However the number of LED pulses to reach this quality threshold may not be applicable in all conditions. For example, when such a device is being used in the dark with a reflective target that is close to the sensor, the quality may be met in a reduced number of LED pulses than if there is more ambient light and the target is further away.

By incorporating a feedback loop into the system, the quality may be measured for each LED pulse. After an acceptably stable quality is reached (for example, the metric given above reaches a predetermined threshold level), the range may then be calculated and output. This results in a reduced number of LED pulses to obtain a valid range value, as only the number of pulses to meet a particular quality threshold are used.

Such a quality derived automatic exposure control therefore has the advantages of removing the need for the user to enter a fixed accumulation period, thereby reducing user setup and reducing latency and power consumption of the system. This feature may be particularly useful for an ultra-low power mode where the proximity detection apparatus probes for an object every couple of milliseconds. It should be noted that the terms "optical", "illumination" and "light" are intended to cover other wavelength ranges in the spectrum and are not limited to the visual spectrum.

Figure 2:
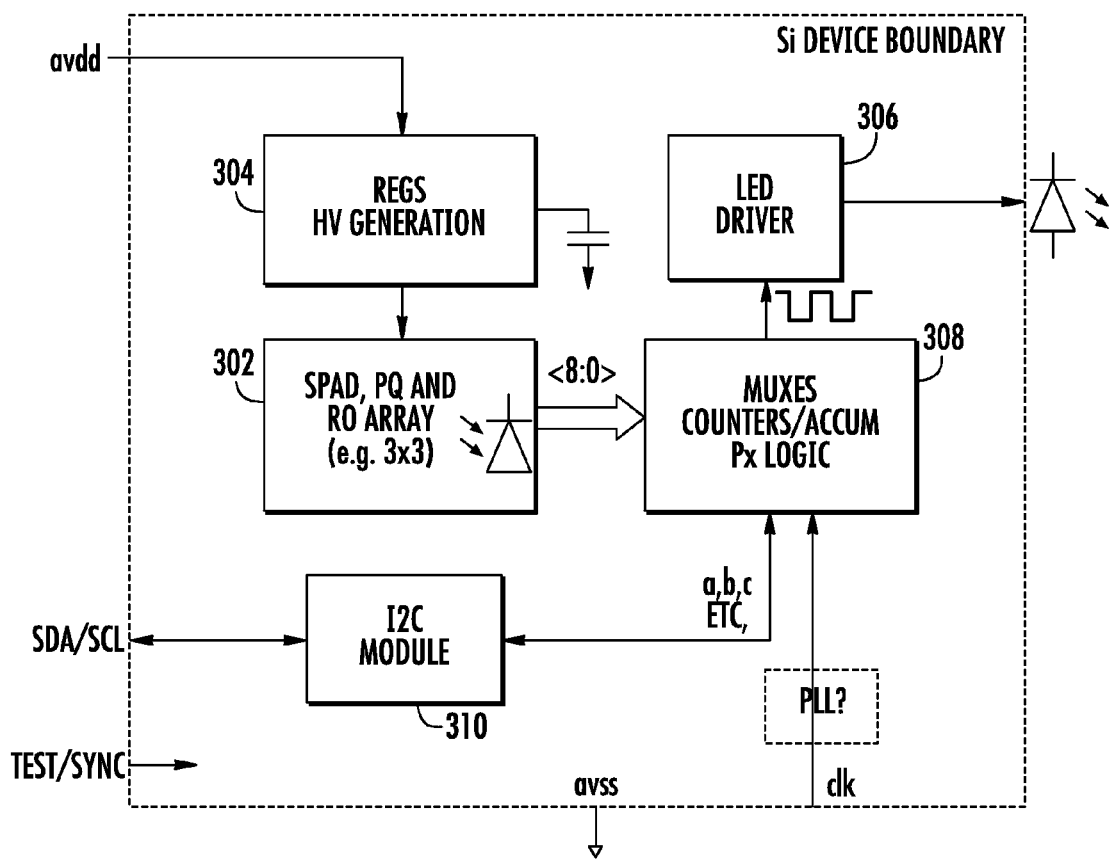
FIG. 2 is a schematic block diagram of a proximity detector in accordance with an embodiment of the present invention.

Referring to FIG. 2, a block diagram of a proximity sensor according to or suitable for use with the embodiments is shown, depending on the location of the computation logic. The proximity sensor 300 includes a SPAD function and the quenching thereof in block 302. The quenching can be passive, as shown, or of any other suitable type. The bias voltage for the SPAD may be provided by a charge pump or any other suitable device 304. The sensor module also includes an LED or other illumination source and an associated driver 306 to apply modulation to the illumination source.

The proximity sensor 300 includes multiplexers and counters 308 and a storage means 310, such as an I2C module. The sensor may include a distance computation logic module to determine range. Alternatively, this can be located in a host device, in which the range sensor is used. This distance computation logic may also be arranged to calculate the quality metric and perform the automatic exposure control functions described above. The sensor may also include a Phase Locked Loop (PLL) for clocking and subsequent timed signal generation purposes.

The power consumption of SPADs and their readout circuits is dependent on the incident photon arrival rate. The average power consumption of a ranging system could be reduced by using power saving modes, such as pulsed on/off operation, at a rate of ~10 Hz, for example, at the expense of the target motion distortion. Most of the power consumption of the chip is consumed driving the LED, so relatively significant power savings may be made.

The sensor may be implemented on a 1 mm die size, and the I2C module could also be implemented on an appropriate die. The sensor may include an optical package, an integral IR bandpass filter, (either coating or inherent in the optical elements), and an optimal field of view of about 30°. As the sensor is not intended to "create an image," but is instead used so that as many photons as possible are detected, the optics could be made from injection molded hemispherical elements. The illuminator source may ideally be of a non-visible wavelength, for example in the Near Infra Red (NIR) band, such as 850 nm.

As previously indicated, the proximity sensor is very versatile and may be used in a vast array of different applications. It will therefore be appreciated that many variations of the present embodiments could apply and are intended to be encompassed within the scope of the claims.

That which is claimed:

1. A proximity detection apparatus comprising:
    an illumination source;
    an array of single photon avalanche diodes (SPADs) configured so that illumination from said illumination source is reflected by a target to said array of SPADs; and
    circuitry coupled to said array of SPADs and configured to
        determine a number of events based upon said array of SPADs,
        determine a quality metric based upon the number of events, and
        determine an output when the quality metric is at a threshold level.

2. The proximity detection apparatus of claim 1, wherein the quality metric is based upon a total number of the events detected by said array of SPADs.

3. The proximity detection apparatus of claim 1, wherein the quality metric is based upon a number of events detected under ambient illumination conditions.

4. The proximity detection apparatus of claim 1, wherein said circuitry is configured to repeat cycles of a detection phase and a calculation phase; and wherein the quality metric is determined for each detection phase such that a duration of each detection phase is based upon a value of its corresponding quality metric.

5. The proximity detection apparatus of claim 4, wherein said circuitry is configured to be in a low power mode where the detection phases are at intervals in a threshold range.

6. The proximity detection apparatus of claim 1, wherein said array of SPADs are arranged in rows and columns.

7. The proximity detection apparatus of claim 1, wherein said circuitry comprises a multiplexer and a counter coupled to said array of SPADs and configured to enable measurement of the reflected illumination.

8. The proximity detection apparatus of claim 1, wherein said circuitry is configured to calculate the output using a range equation based upon a phase difference between the illumination provided and the reflected illumination.

9. The proximity detection apparatus of claim 8, wherein said circuitry is configured to determine the phase difference by dividing time into two equal duration intervals which alternate repeatedly, the duration of each interval being based upon a modulation frequency of the illumination source, the phase difference being based upon an interval in which the events were detected.

10. A proximity detection apparatus comprising:
an array of single photon avalanche diodes (SPADs) configured so that illumination is reflected by a target to said array of SPADs; and
circuitry coupled to said array of SPADs and configured to
determine a quality metric, and
calculate an output when the quality metric is at a threshold level.

11. The proximity detection apparatus of claim 10, wherein the quality metric is based upon a total number of events detected by said array of SPADs.

12. The proximity detection apparatus of claim 10, wherein the quality metric is based upon a number of events detected under ambient illumination conditions.

13. The proximity detection apparatus of claim 10, wherein said circuitry is configured to repeat cycles of a detection phase and a calculation phase; and wherein the quality metric is determined for each detection phase such that a duration of each detection phase is based upon a value of its corresponding quality metric.

14. A method of regulating a quality of data output by a proximity detector comprising an array of single photon avalanche diodes (SPADs), the method comprising:
turning on an illumination source so that illumination from the illumination source is reflected by a target to the array of SPADs;
counting a number of events detected by the array of SPADs;
determining a quality metric based upon the number of events counted; and
calculating an output, when the quality metric is at a threshold level, and based upon the number of events counted.

15. The method of claim 14, wherein the quality metric is based upon a total number of events detected by the array of SPADs.

16. The method of claim 14, wherein the quality metric is based upon a number of events detected under ambient illumination conditions.

17. The method of claim 14, further comprising repeating cycles of a detection phase and a calculation phase, wherein the quality metric is determined for each detection phase such that a duration of each detection phase is based upon a value of its corresponding quality metric.

18. The method of claim 17, wherein the detection phases are at intervals in a threshold range.

19. The method of claim 14, wherein the output is calculated using a range equation based upon a phase difference between the illumination from the illumination source and reflected illumination.

20. A non-transitory computer readable medium for use with a proximity detection apparatus comprising an array of single photon avalanche diodes (SPADs), and having computer-executable instructions for causing the proximity detection apparatus to perform steps comprising:
turning on an illumination source so that illumination from the illumination source is reflected by a target to the array of SPADs;
counting a number of events detected by the array of SPADs;
determining a quality metric based upon the number of events counted; and
calculating an output, when the quality metric is at a threshold level, and based upon the number of events counted.

21. The non-transitory computer-readable medium of claim 20, wherein the quality metric is based upon a total number of events detected by the array of SPADs.

22. The non-transitory computer-readable medium of claim 20, wherein the quality metric is based upon a number of events detected under ambient illumination conditions.

23. The non-transitory computer-readable medium of claim 20, wherein the computer-executable instructions are for repeating cycles of a detection phase and a calculation phase, wherein the quality metric is determined for each detection phase such that a duration of each detection phase is based upon a value of its corresponding quality metric.

24. The non-transitory computer-readable medium of claim 23, wherein the detection phases are at intervals in a threshold range.

25. The non-transitory computer-readable medium of claim 20, wherein the output is calculated using a range equation based upon a phase difference between the illumination from the illumination source and reflected illumination.

* * * * *